United States Patent
Wildstone et al.

(10) Patent No.: US 10,455,722 B1
(45) Date of Patent: Oct. 22, 2019

(54) EXTERNALLY-MOUNTED POWER SUPPLY CONTAINMENT UNIT

(71) Applicant: Amazon Technologies, Inc., Seattle, WA (US)

(72) Inventors: Kelsey Michelle Wildstone, Seattle, WA (US); Nigel Martin McGee, Ashburn, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/608,728

(22) Filed: May 30, 2017

(51) Int. Cl.
*H05K 7/14* (2006.01)
*G06F 1/26* (2006.01)
*G06F 1/18* (2006.01)

(52) U.S. Cl.
CPC ........... *H05K 7/1492* (2013.01); *G06F 1/189* (2013.01); *G06F 1/26* (2013.01); *G06F 1/18* (2013.01); *H05K 7/1488* (2013.01)

(58) Field of Classification Search
None
See application file for complete search history.

(56) References Cited

U.S. PATENT DOCUMENTS

| 9,041,250 B1* | 5/2015 | Czamara | H02J 3/14 307/64 |
|---|---|---|---|
| 9,891,682 B1* | 2/2018 | Czamara | G06F 1/266 |
| 2005/0237724 A1* | 10/2005 | Fiorentino | G06F 1/189 361/752 |
| 2007/0217125 A1* | 9/2007 | Johnson | H02J 9/062 361/600 |
| 2007/0217178 A1* | 9/2007 | Johnson, Jr. | H05K 7/1457 361/826 |
| 2013/0135811 A1* | 5/2013 | Dunwoody | G06F 1/189 361/679.31 |
| 2015/0357798 A1* | 12/2015 | Loeffler | H02B 1/20 361/624 |
| 2017/0047772 A1* | 2/2017 | Wang | H05K 7/1492 |

(Continued)

OTHER PUBLICATIONS

U.S. Appl. No. 15/628,010, filed Jun. 20, 2017, Mike MacGregor.
(Continued)

*Primary Examiner* — Courtney L Smith
(74) *Attorney, Agent, or Firm* — Robert C. Kowert; Meyertons, Hood, Kivlin, Kowert & Goetzel, P.C.

(57) ABSTRACT

An external power supply containment unit includes a chassis configured to mount to a structure external to a rack. The external power supply containment unit further includes one or more discrete power supplies mounted in the chassis and one or more electrical connectors that are configured to couple and decouple with a power distribution system of a rack positioned adjacent to the external power supply containment unit. The electrical connectors are configured such that racks of electrical devices, such as computers, can be replaced while the external power supply containment unit remains mounted to the external structure. Additionally, discrete power supply units included in the external power supply containment unit may be re-used to provide power to electrical devices included in a replacement rack when a rack of electrical devices coupled with the external power supply containment unit is replaced.

20 Claims, 14 Drawing Sheets

(56) References Cited

U.S. PATENT DOCUMENTS

2017/0111451 A1* 4/2017 Thul .................... H04L 67/125

OTHER PUBLICATIONS

U.S. Appl. No. 15/608,728, filed May 30, 2017, Wildstone, et al.
LiteOn, "Datasheet," Lite-On Power System Solutions, Dec. 2016, pp. 1-10.
LiteOn; Power System Solutions, "Are you buying technology that you already own?," downloaded on Mar. 15, 2017, pp. 1-8.
U.S. Appl. No. 15/715,760, filed Sep. 26, 2017, Michael Jon Moen, et al.
U.S. Appl. No. 15/862,013, filed Sep. 22, 2015, Patel.
U.S. Appl. No. 14/656,356, filed Mar. 12, 2015, Ross, et al.
U.S. Appl. No. 15/070,969, filed Mar. 15, 2016, Morales, et al.

* cited by examiner

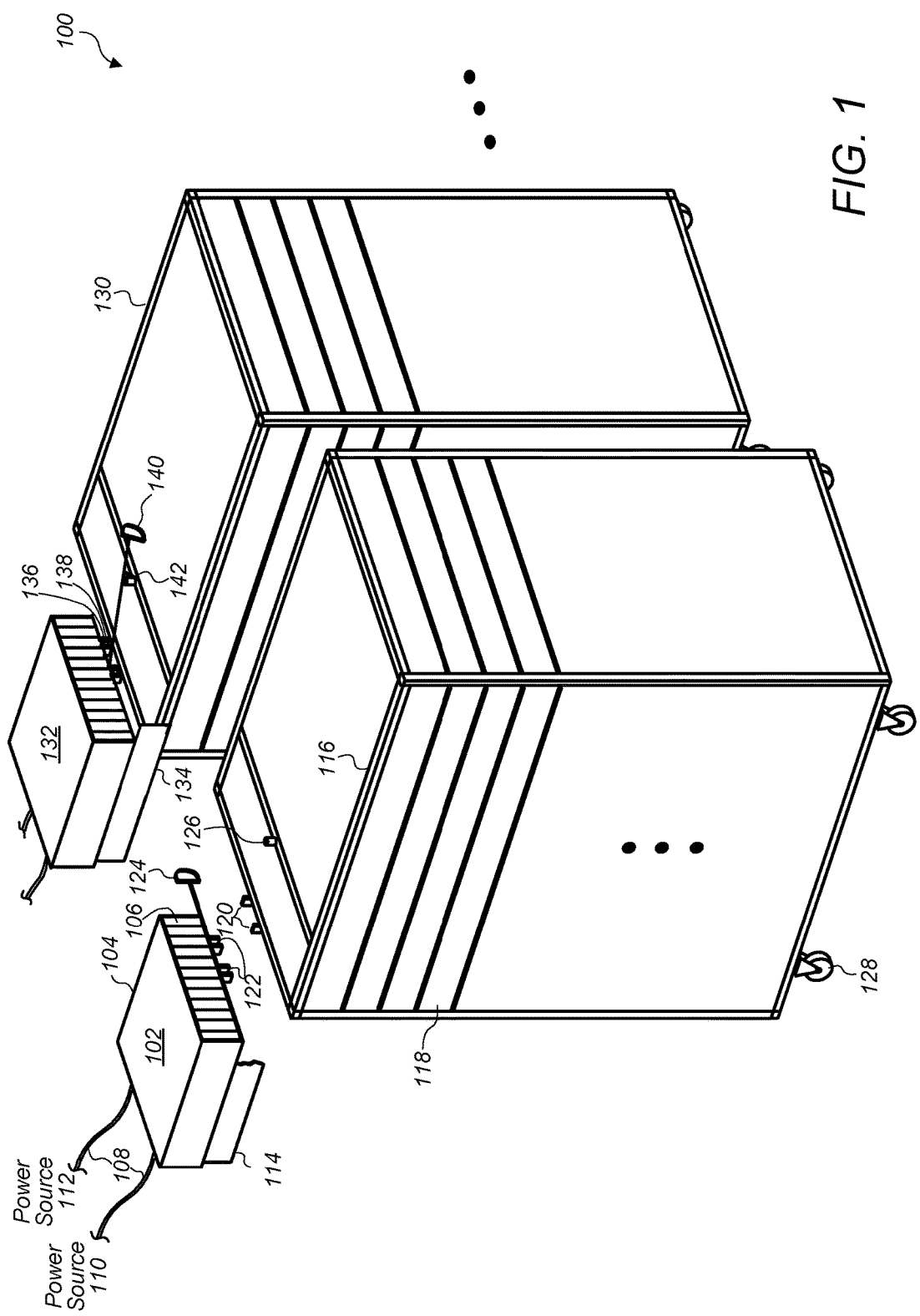

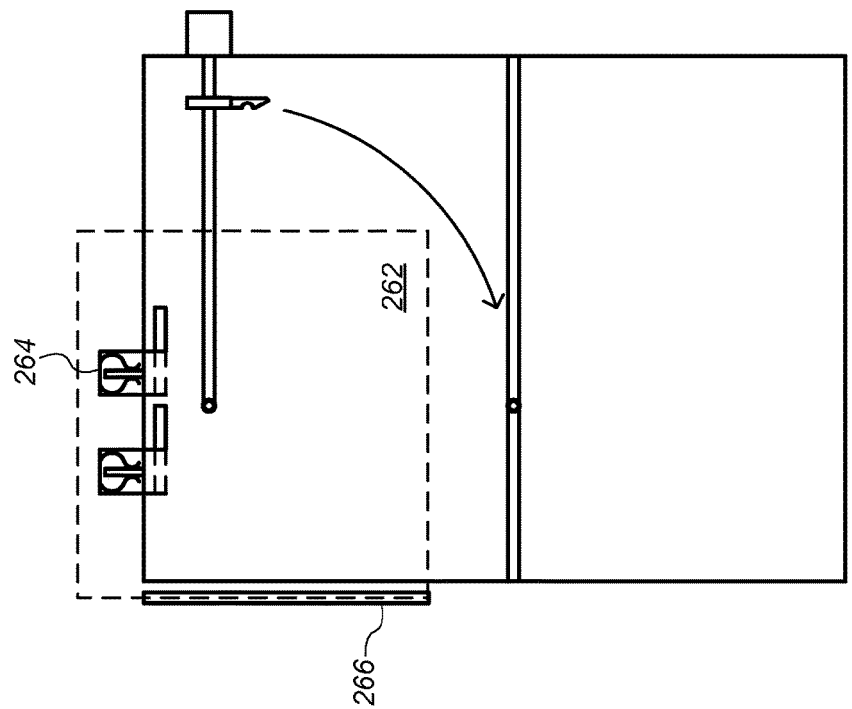
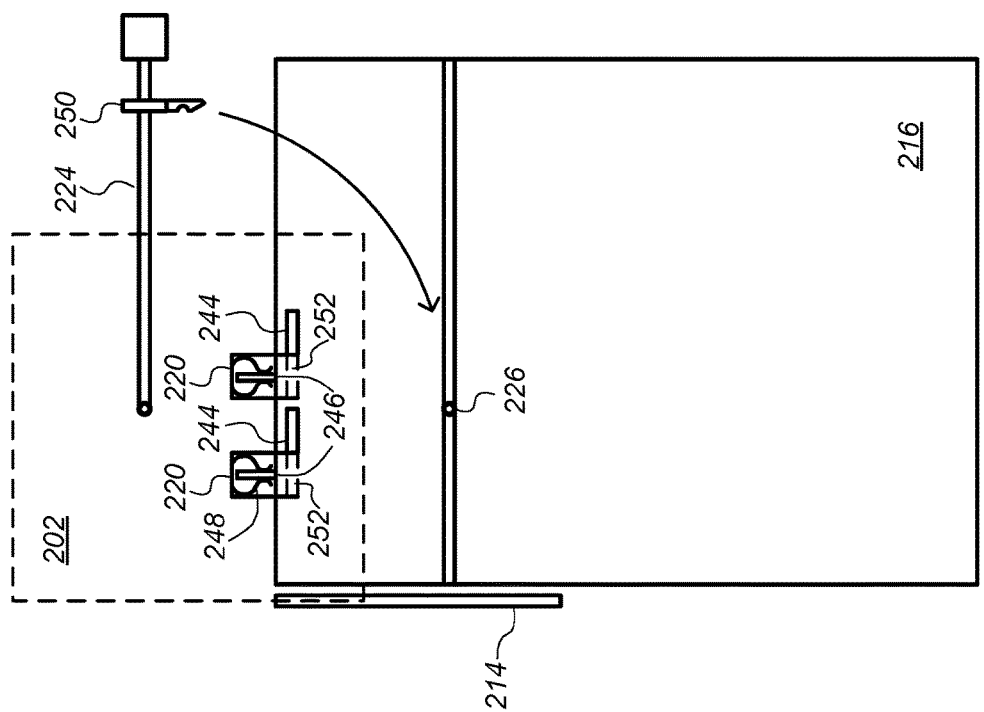

EXTERNALLY-MOUNTED POWER SUPPLY CONTAINMENT UNIT

BACKGROUND

In some computing facilities, each server in a rack may include its own power supply that converts higher voltage alternating current power into lower voltage direct current power suitable for consumption by computing devices included in the servers. Other computing facilities may include computing devices, such as servers, mounted in a rack that includes a common power supply mounted in the rack. The common power supply may convert higher voltage alternating current power into lower voltage direct current power suitable for consumption by the computing devices mounted in the rack.

In some situations, power supplies included in individual servers or power supplies mounted in a rack and shared by multiple computing devices may have a usable life that exceeds a usable life of the servers or computing devices that are supported by the power supplies. Thus, power supplies with remaining usable life may be prematurely replaced when servers or racks are upgraded. Additionally power supplies included in individual servers or common power supplies mounted in racks may occupy space in a rack that could otherwise be occupied by additional servers or computing devices. In a similar manner, power supplies included in individual servers or common power supplies mounted in racks may generate waste heat that consumes cooling resources or other shared resources that could otherwise be used to support additional servers or computing devices mounted in the rack.

BRIEF DESCRIPTION OF THE DRAWINGS

FIG. 1 is a schematic diagram illustrating a perspective view of external power supply containment units and racks of electrical devices, according to some embodiments.

FIG. 2A is a schematic diagram illustrating a top view of an external power supply containment unit with front mounted electrical connectors and a rack of electrical devices, according to some embodiments.

FIG. 2B is a schematic diagram illustrating a top view of an external power supply containment unit with rear mounted electrical connectors and a rack of electrical devices, according to some embodiments.

Figure 3B:
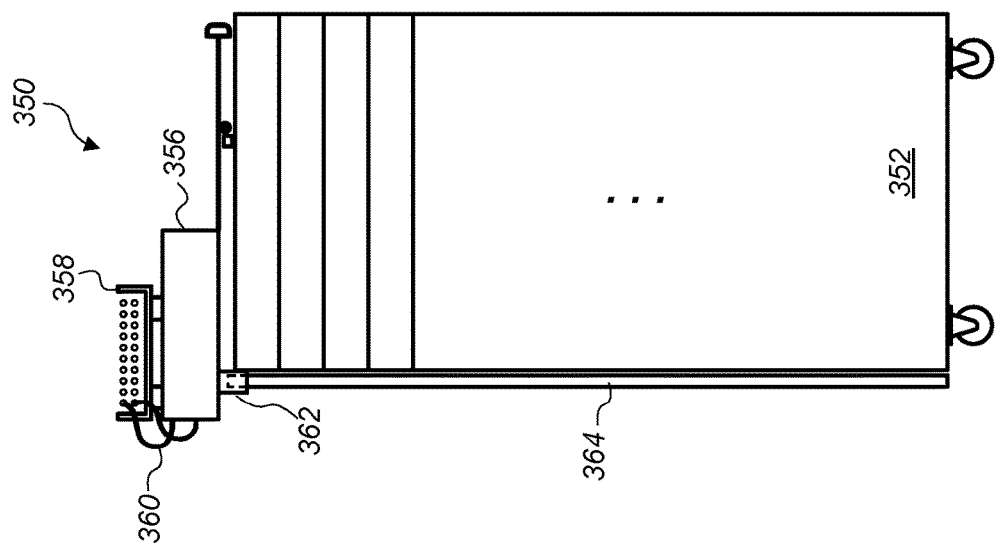
FIG. 3B is a schematic diagram illustrating a side view of an external power supply containment unit mounted beneath an elevated structure and a rack of electrical devices, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of an external power supply containment unit, and systems and methods of using an external power supply containment unit, are disclosed. According to one embodiment a system includes a rack with computing devices mounted in the rack and a power distribution bus bar configured to transmit electrical power to the computing devices of the rack. The system also includes a power supply containment unit mounted to a structure external to the rack. The power supply containment unit includes a chassis, a power inlet configured to receive electrical power from a power source, power supplies mounted in the chassis and configured to convert the electrical power from the power source into direct current electrical power for consumption by the computing devices of the rack, and a connection socket configured to couple electrical outputs of the power supplies to the power distribution bus bar of the rack. In some embodiments, an external power supply containment unit may be mounted to a structure in a data center and provide direct current electrical power to computing devices in the data center, such as servers mounted in a rack of the data center. In some embodiments, an external power supply containment unit may be used in lieu of including power supplies in servers or in a rack. For example, in some embodiments, computing devices mounted in a rack that receives direct current electrical power from an external power supply containment unit may not include server power supplies or may include server power supplies with fewer components than are typically included in server or rack power supplies. For example, a rectifier circuit may be omitted from a server power supply that receives direct current electrical power from an external power supply containment unit. Also, in some embodiments, computing devices mounted in a rack that receive direct current electrical power from an external power supply containment unit may include server power supplies that are configured to receive lower voltage power than power supplies typically included in servers or racks.

According to one embodiment, a system includes a power supply containment unit that includes a chassis configured to mount to a structure external to a rack. The power supply containment unit also includes a power inlet configured to receive electrical power from a power source, power supplies mounted in the chassis and configured to convert the electrical power from the power source into direct current electrical power for consumption by electrical devices mounted in the rack, and an electrical connector configured to couple outputs of the power supplies to a power distribution system of the rack.

According to one embodiment, a method includes positioning a rack comprising electrical devices in a position adjacent to a power supply containment unit mounted in a structure external to the rack, engaging an electrical connector of the power supply containment unit with a member of a power distribution system of the rack, and providing direct current electrical power to the electrical devices mounted in the rack from power supplies of the power supply containment unit via the electrical connector engaged with the member of the power distribution system of the rack. For example, a rack and rack components, such as servers, may be exchanged or upgraded while an external power supply containment unit remains mounted to a structure external to the rack. The external power supply containment unit may then be used to provide direct current electrical power to rack components of a replacement rack.

As used herein, a "cable" includes any cable, conduit, or line that carries one or more conductors and that is flexible over at least a portion of its length. A cable may include a connector portion, such as a plug or socket, at one or more of its ends.

As used herein, "chassis" means a structure or element that supports another element or to which other elements can be mounted. A chassis may have any shape or construction, including a frame, a sheet, a plate, a box, a channel, or a combination thereof. A chassis for a power supply containment unit may support power supply units, fans, cables, batteries, automatic transfer switches, interlocks, and other components of a power supply containment unit.

As used herein, a "computing device" includes any of various computer systems or components thereof. One example of a computing device is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, an "interlock" includes any device or mechanism that prevents the operation of another device or mechanism unless one or more conditions are met. For example, an interlock may prevent electrical components of an external power supply containment unit from being energized unless one or more conditions are met. In some embodiments, an interlock may include mechanical interlock components, electrical interlock devices, or some combination thereof.

As used herein, "locking mechanism" includes an element or combination of elements that can be used to couple one element or structure to one or more other elements or structures. Also, a locking mechanism may be used to secure one element or structure in a position adjacent to one or more other elements or structures.

As used herein, a "pin" includes any element that can be positioned or coupled with to constrain or hold another element in a desired position or orientation. Suitable pins may include straight pins, pegs, threaded bolts, unthreaded bolts, bars, plates, hooks, clasps, rods, clamps, clips, or screws.

As used herein, "power distribution system" means any device, module, component, or combination thereof, that can be used to distribute electrical power. The elements of a power distribution system may be embodied within a single component or assembly (such as a power bus bar or a rack power distribution unit), or may be distributed among two or more components or assemblies (such as multiple power bus bars or multiple rack power distribution units each housed in a separate enclosure, and associated cables, etc.).

As used herein, a "rack" means a rack, container, frame, or other element or combination of elements that can contain or physically support one or more electrical devices.

As used herein, "rack power distribution unit" refers to a power distribution unit that can be used to distribute electrical power to various components in a rack. A rack power distribution unit may include various components and elements, including wiring, bus bars, connectors, and circuit breakers.

Some facilities, such as data centers, may include multiple racks each comprising computing devices, such as servers, networking equipment, or other types of computing devices. In some facilities each of the computing devices may include its own separate power supply unit that is configured to supply electrical power to electrical components within the computing device. Also, other facilities may include a shared power supply unit mounted in a rack that is configured to supply electrical power to components of multiple computing devices mounted in the rack. However, in either case, when computing devices and/or racks of computing devices are upgraded, the power supplies included in the computing devices or mounted in the racks may be removed along with the computing devices and/or racks of computing devices that are being upgraded. In many cases, the power supplies may be discarded or broken down into constituent parts for recycling, for example the metal, plastic, etc. included in the power supplies may be recycled.

In many cases, a power supply unit may have a usable life that exceeds a useable life of a computing device in which the power supply is included or a usable life of computing devices mounted in a rack that includes the power supply. For example, some power supplies may have a nine year usable life, whereas some computing devices that include such power supplies may have a lifespan of fewer years, for example in some cases three years. Thus, often power supplies are discarded or otherwise taken out of service that have a considerable amount of usable life remaining.

Additionally, power supply units included in servers or common power supply units mounted in racks may occupy space in the servers or racks that could otherwise be used to mount additional computing components in the servers or additional computing devices in the racks. In a similar manner, power supply units included in servers or common power supply units included in racks may consume shared resources of the servers or racks. For example, a power supply unit included in a server may generate waste heat, which in turn may cause cooling air flowing through the server to be heated. The heated cooling air may have less capacity to remove waste heat from other heat producing components of the server than the cooling air would have if the cooling air was not heated by waste heat from the power supplies. In some situations, cooling capacity may be a restraint that prevents higher capacity components from being included in a server design. Also, in some situations, additional waste heat generation from power supplies mounted in servers or racks may lead to inefficient operation of a server or rack.

In some embodiments, a power supply may be mounted external to a server or rack. For example, a power supply may be mounted in an external power supply containment unit. A power supply mounted in an external power supply containment unit may free up additional space and cooling resources in servers and/or racks such that additional computing devices or computing components of a computing device may be included in the servers or racks. Also, a power supply included in an external power supply containment unit may be separated from a server and rack such that the server and rack can be exchanged without exchanging the power supply included in the external power supply containment unit. In some embodiments, power supplies included in an external power supply containment unit may be re-used to supply power to computing devices subsequent to existing computing devices that receive power from the power supplies being replaced. Thus, power supplies included in an external power supply containment unit may be used for a greater portion of their usable life instead of being prematurely taken out of service. This in turn, may lead to cost savings for operators of computing facilities.

FIG. 1 is a schematic diagram illustrating a perspective view of external power supply containment units and racks of electrical devices, according to some embodiments.

A facility, such as data center 100, may include one or more external power supply containment units mounted to a structure external to racks of the facility. For example, data center 100 includes power supply containment units 102 and 132 mounted external to racks 116 and 130. Power supply containment unit 102 includes chassis 104 and discrete power supply units 106 mounted in chassis 104. Power supply containment unit 102 also includes power inlet cables 108 coupled with chassis 104. In some embodiments, an external power supply containment unit may be coupled to multiple power sources and receive electrical power from any one of the multiple power sources. For example, power supply containment unit 102 may receive electrical power from power source 110 via one of inlet cables 108 or from power source 112 via a different one of inlet cables 108. Power supply containment unit 132 may include the same components as power supply containment unit 102.

In some embodiments, an external power supply containment unit, such as power supply containment unit 102, is configured to couple with a power distribution system of a rack and provide direct current (DC) power suitable for consumption by electrical devices, such as computing devices, mounted in the rack. In some embodiments, an external power supply containment unit, such as power supply containment unit 102, may include one or more power supplies, such as discrete power supply units 106, each comprising one or more rectifiers, transformers, filters, or other electrical devices configured to condition electrical power received from a power source such that the electrical power is suitable for consumption by electronic components of an electrical device, such as processors, memory devices, etc. of a server, networking device, or other type of computing device.

In some embodiments, an external power supply containment unit may receive alternating current (AC) power at a higher voltage, for example, at voltages greater than 100 volts AC, and may provide direct current power at a lower voltage, for example at voltages at or about 12-48 volts DC, to electronic devices mounted in a rack. For example, discrete power supplies 106 of power supply containment unit 102 may be configured to condition AC power received from power source 110 or power source 112 into DC electrical power suitable for consumption by components of electrical devices 118 mounted in rack 116.

In some embodiments, an external power supply containment unit, such as power supply containment unit 102, may include a guide rail configured to position a rack of electrical devices, such as rack 116, adjacent to the power supply containment unit such that an electrical connector of the power supply containment unit is aligned with an electrical connector of the rack of electrical devices. For example, power supply containment unit 102 includes guiderail 114 configured to align rack 116 of electrical devices 118 such that connection sockets 122 of power supply containment unit 102 are aligned with respective end portions of power bus bars 120.

In some embodiments, an external power supply containment unit, such as power supply containment unit 102, may further include a locking mechanism configured to engage with a pin mounted on a rack. For example power supply containment unit 102 includes locking mechanism 124 configured to engage with pin 126 of rack 116. In some embodiments, a rack, such as rack 116, may include wheels such as wheels 128. A technician may position a rack of electrical devices, such as rack 116, in a position adjacent to a power supply unit, such as power supply unit 102, by aligning an edge of the rack with a guiderail, such as guiderail 114, of an external power supply containment unit. The technician may then secure the rack, for example rack 116, by engaging a locking mechanism of an external power supply containment unit with a pin of the rack. For example, by engaging locking mechanism 124 of power supply containment unit 102 with pin 126. Note that in FIG. 1, an additional external power supply containment unit 132 is shown that is secured to rack 130 via locking mechanism 140 of power supply containment unit 132 being engaged with pin 142 of rack 130.

Also, note that a cutaway view of guiderail 114 is illustrated in FIG. 1 to better illustrate other components of power supply containment unit 102. However, in some embodiments, a guiderail, such as guiderail 114, may extend out in front of an external power supply unit and may also extend below an external power supply containment unit. For example, power supply containment unit 132 includes guiderail 134 that aligns rack 130 with power supply containment unit 132 such that electrical connectors 136 of power supply containment unit 132 align with end portions of power bus bars 138 of rack 130. Also, locking mechanism 140 of power supply containment unit 132 is engaged with pin 142 of rack 130 to secure rack 130 in a position adjacent to power supply containment unit 132 such that the alignment of electrical connectors 136 and power bus bars 138 is maintained. In some embodiments, electrical connectors 136 of power supply containment unit 132 may be connection sockets, such as connection sockets 122 of power supply containment unit 102.

In some embodiments, racks of electrical devices such as racks 116 or 130 may be removed and/or exchanged while external power supply containment units remain mounted to a structure external to the racks. For example, rack 116 may be removed and replaced with another rack of upgraded electrical devices 118. An external power supply containment unit, such as power supply containment unit 102, may then be used to provide direct current (DC) electrical power conditioned for consumption by the electrical devices of the new rack of electrical devices, such as a rack that replaces rack 116.

In some embodiments, guide rails, such as guiderails 114 and 134 may be omitted. In some such embodiments that omit guiderails, racks and external power supply containment units may be arranged such that the rack arrangement is used to align the racks with the external power supply containment units. For example, a row of racks including racks 116, 130, and/or one or more additional racks may include rack positions and corresponding external power supply containment units positioned such that a first rack in a first rack position acts as a guide for an adjacent rack in an adjacent rack position. For example, rack 116 may be aligned with power supply containment unit 102 by positioning rack 116 adjacent to rack 130. In some embodiments, such an arrangement may be used with external power supply containment units that also include guiderails.

FIG. 2A is a schematic diagram illustrating a top view of an external power supply containment unit with front mounted electrical connectors and a rack of electrical devices, according to some embodiments.

Power supply containment unit 202 illustrated in FIG. 2A may be the same external power supply containment unit as power supply containment unit 102 or 132 illustrated in FIG. 1.

The top view of power supply containment unit 202 shown in FIG. 2A may better illustrate connection sockets, safety shutters, and a locking mechanism of an external power supply containment unit, according to some embodiments. For example, power supply containment unit 202 includes connection sockets 220 configured to accept a portion of a power bus bar. In some embodiments, connection sockets of an external power supply containment unit, such as connection sockets 220, may include a flexible connector that acts a spring to clamp around a portion of a power bus bar. For example, connection sockets 220 include spring clamps 248 clamped to respective ends power bus bars 246. A flexible connector, such as one of spring clamps 248, may be made out of a pliable conductive material, such as copper, and may clamp down on a portion of a power bus bar when the power bus bar is inserted into the connection socket. In some embodiments, flexible connectors, such as spring clamps 248, may complete electrical connections between power bus bars of a rack and an external power supply containment unit. In some embodiments, a flexible connector, such as one of spring clamps 248, may be made out of other conductive pliable materials, such as aluminum, steel, etc. In some embodiments, a connection socket, such as one of connection sockets 220, may include one or more connectors with adjustable parts. For example, in some embodiments, instead of spring clamps 248, a connection socket, such as one of connection sockets 220, may include connectors with actuated components such as a clamp that engages with a portion of a power bus bar.

In some embodiments, an external power supply containment unit, such as power supply containment unit 202, includes safety shutters configured to shield an end of a power bus bar inserted into a connection socket such that the energized bus bar is not accessible from outside of the external power supply containment unit. For example, power supply containment unit 202 includes safety shutters 244 that are configured to slide over openings 252 to cover openings 252 when a portion of a bus bar, such as bus bar 246, is inserted in connection sockets 220. In some embodiments, openings of an external power supply containment unit, such as openings 252, may be sized such that an end of a power bus bar can fit into the opening, but a human finger or hand will not fit into the opening. This may provide further safeguards in addition to safety shutters to prevent accidental exposure to energized bus bars.

In some embodiments, a locking mechanism, such as locking mechanism 224, may secure a rack in a position adjacent to an external power supply containment unit. In some embodiments, a locking mechanism may include a clasp, such as clasp 250, configured to engage with a pin of a rack, such as pin 226 of rack 216, to secure the rack in place. Also, in some embodiments, a guiderail such as guiderail 214 may align a rack, such as rack 216, with an external power supply containment unit, such as power supply containment unit 202, such that power bus bars of the rack, such as bus bars 246, align with electrical connectors of the external power supply containment unit, such as connection sockets 220. In some embodiments, a rack may be aligned in a position adjacent to an external power supply containment unit using a guiderail, such as guiderail 214, and may be secured in place by engaging a locking mechanism, such as locking mechanism 224.

FIG. 2B is a schematic diagram illustrating a top view of an external power supply containment unit with rear mounted electrical connectors and a rack of electrical devices, according to some embodiments. Power supply containment unit 262 is a similar external power supply containment unit as power supply containment unit 102 and 132 illustrated in FIG. 1 and power supply containment unit 202 illustrated in FIG. 2B. However, in some embodiments, an external power supply containment unit, such as power supply containment unit 262, may include electrical connectors located in a rear position of the external power supply containment unit. For example, connection sockets 264 are located towards the rear of a bottom surface of power supply containment unit 262, whereas connection sockets 220 are located in a forward or front position on a bottom surface of power supply containment unit 202, as illustrated in FIG. 2A. In some embodiments, positioning electrical connectors, such as connection sockets 264, towards a rear portion of an external power supply containment unit, may allow the power supply containment unit to mount over a rack, thus saving space in a facility, such as a data center. Also, in some embodiments, a guiderail of an external power supply containment unit, such as guiderail 266 of power supply containment unit 262, may extend along a side of an external power supply containment unit so that the guiderail guides a rack into place as the rack is inserted under the power supply containment unit. This may help align electrical connectors of the external power supply containment unit such that power bus bars of a rack engage with the electrical connectors, such as connection sockets 264, located in a rear portion of the external power supply containment unit.

In some embodiments, an external power supply containment unit may mount to an elevated structure at a facility. For example, in some embodiments, an external power supply containment unit may mount above or below a cable tray at a facility, such as a data center. For example, FIG. 3A is a schematic diagram illustrating a side view of an external power supply containment unit mounted above an elevated structure and a rack of electrical devices, according to some embodiments. Data center 300 includes cable tray 308. Power supply containment unit 306 is mounted above cable tray 308 and cables 310 from cable tray 308 are connected as power sources to power supply containment unit 306. Rack 302 of electrical devices 304, such as computing devices, is positioned adjacent to power supply containment unit 306, such that portions of bus bars 314 are positioned in connection sockets 312 of power supply containment unit 306.

Figure 3A:
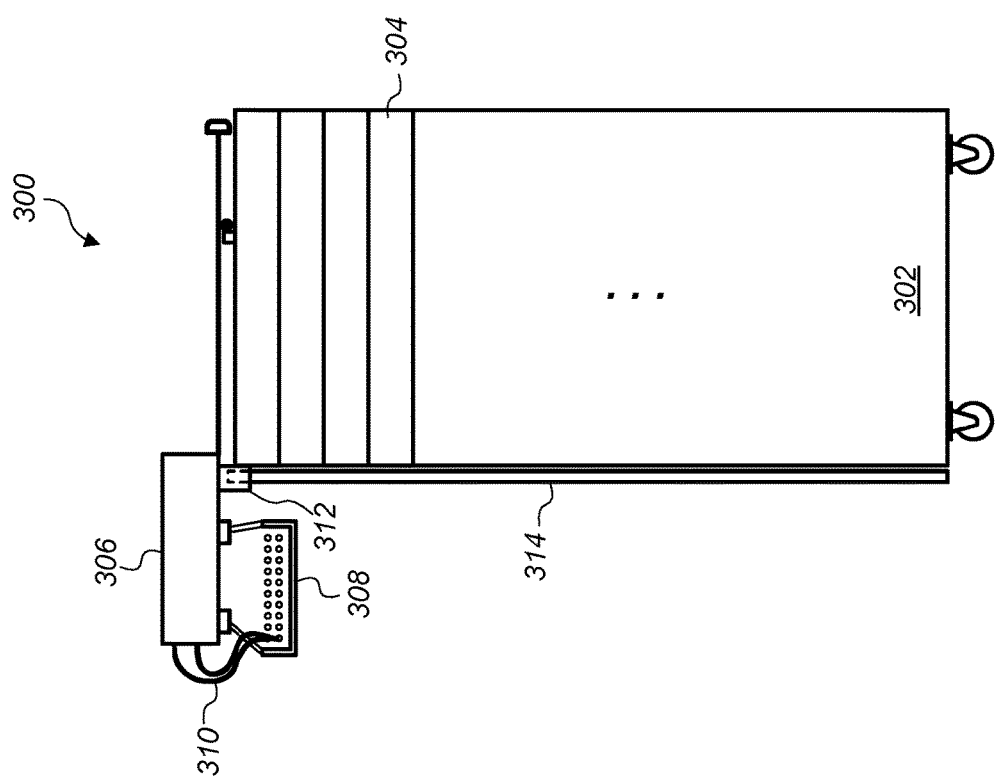
FIG. 3A is a schematic diagram illustrating a side view of an external power supply containment unit mounted above an elevated structure and a rack of electrical devices, according to some embodiments.

As another example, FIG. 3B is a schematic diagram illustrating a side view of an external power supply containment unit mounted beneath an elevated structure and a rack of electrical devices, according to some embodiments. Data center 350 includes cable tray 358 with power supply containment unit 356 mounted below cable tray 358. Cables 360 from cable tray 358 are connected as power sources for power supply containment unit 356. Connection sockets 362 of power supply containment unit 356 are located in a rear position along a bottom side of power supply containment unit 356 and are engaged with end portions of power bus bars 364 of rack 352. In contrast to power supply containment unit 356 illustrated in FIG. 3B, connector sockets 312 of power supply containment unit 306 illustrated in FIG. 3A are located in a forward or front position along a bottom side of power supply containment unit 306. Depending upon an arrangement of structural components and available space at a given facility, such as a data center, it may be advantageous to mount an external power supply containment unit above or below a structural element of the facility as is shown in FIGS. 3A and 3B.

Figure 3C:
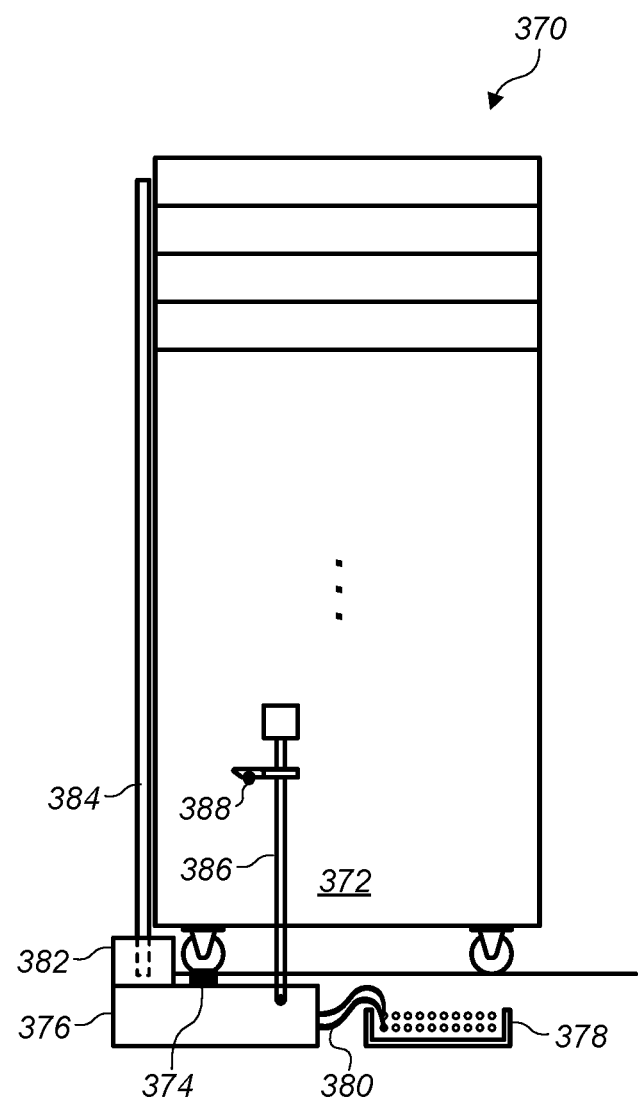
FIG. 3C is a schematic diagram illustrating a side view of an external power supply containment unit mounted in a sub-floor structure and a rack of electrical devices, according to some embodiments.

In some situations, due to space constraints, existing wiring design, or due to other reasons, it may be advantageous to mount an external power supply containment unit in a space below a rack, for example in a space under a raised floor or in a space beneath an actual floor. For example, FIG. 3C is a schematic diagram illustrating a side view of an external power supply containment unit mounted in a sub-floor structure and a rack of electrical devices, according to some embodiments. Data center 370 includes power supply containment unit 376 mounted in a sub-floor space beneath rack 372. Power supply containment unit 376 receives power via cables 380 from cable tray 378. Connection socket 382 of power supply containment unit 376 is on a top side of power supply containment unit 376 and is engaged with a bottom end of power bus bars 384 of rack 372. In some embodiments, a locking mechanism of an external power supply containment unit, may be a recessed floor area. For example, a floor tile, such as floor tile 374, may be recessed and include a limit switch. The recessed floor area may hold a castor of a rack in place such that the rack does not move without intentional force being applied to the rack to move the rack off of the recessed floor area. Also, the limit switch included in the recessed floor area may be part of an interlock that ensures the rack is in place before a connection socket, such as connection socket 382 is electrically energized. For example, a limit switch may include a button that is depressed when a rack is in place on a recessed floor area to indicate the rack is in proper position. In some embodiments, an external power supply unit mounted below a rack may additionally or alternatively include a locking mechanism similar to the locking mechanisms described in FIGS. 2A and 2B and further described in FIGS. 7A-7E. For example, power supply containment unit 376 may include a locking mechanism 386 configured to engage with a pin 388 on a side of rack 372. Any of the external power supply containment units described herein may be mounted above an elevated structure, below an elevated structure, or below a rack as described in FIGS. 3A-3C.

Figure 4:
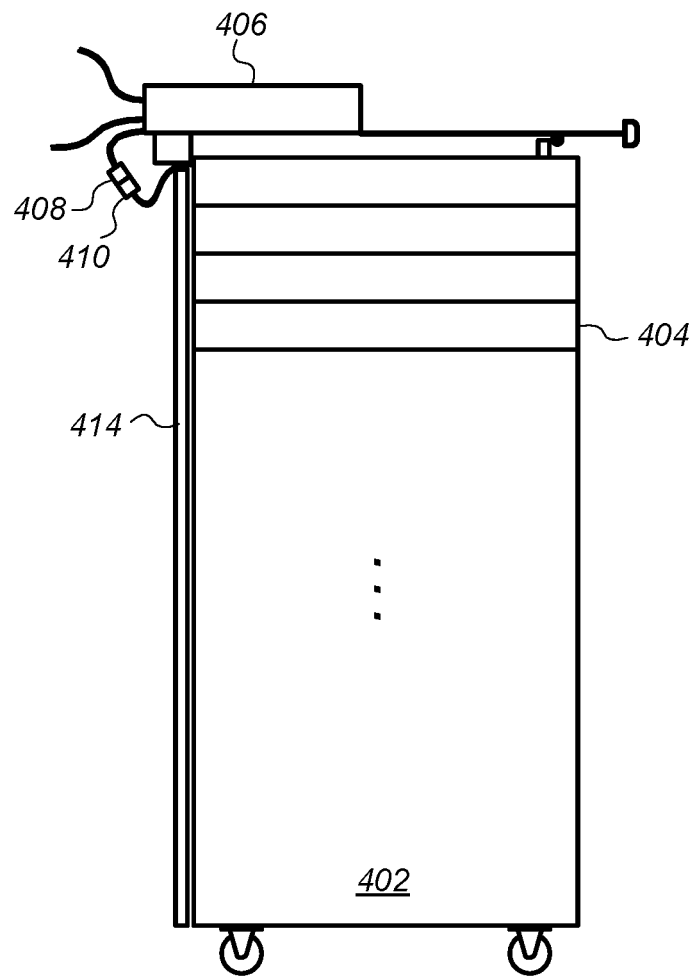
FIG. 4 is a schematic diagram illustrating a side view of an external power supply containment unit coupled to a rack of electrical devices via an electrical plug and socket, according to some embodiments.

In some embodiments, an external power supply containment unit may be connected to a power distribution system of a rack via another type of electrical connector other than a connection socket as described in FIGS. 1-3. For example, FIG. 4 is a schematic diagram illustrating a side view of an external power supply containment unit coupled to a rack of electrical devices via an electrical plug and socket, according to some embodiments. Power supply containment unit 406 is connected to power distribution system 414 of rack 402 via electrical plug 408 of power supply containment unit 406 coupled with electrical socket 410 of power distribution system 414 of rack 402. In some embodiments, the plug end and the socket end may be reversed, for example power supply containment unit 406 may include a socket-end and power distribution system 414 may include a plug-end. In some embodiments, various other types of electrical connectors may be used to electrically couple an external power supply containment unit to a power distribution system of a rack. In some embodiments, power distribution system 414 may include power bus bars, cables, one or more rack power distribution units (PDUs), or other means of distributing DC electrical power to computing devices 404 of rack 402. In some embodiments, any of the external power supply containment units described herein may include electrical connectors as described in regard to FIG. 4 in place of or in addition to connection sockets.

Figure 5:
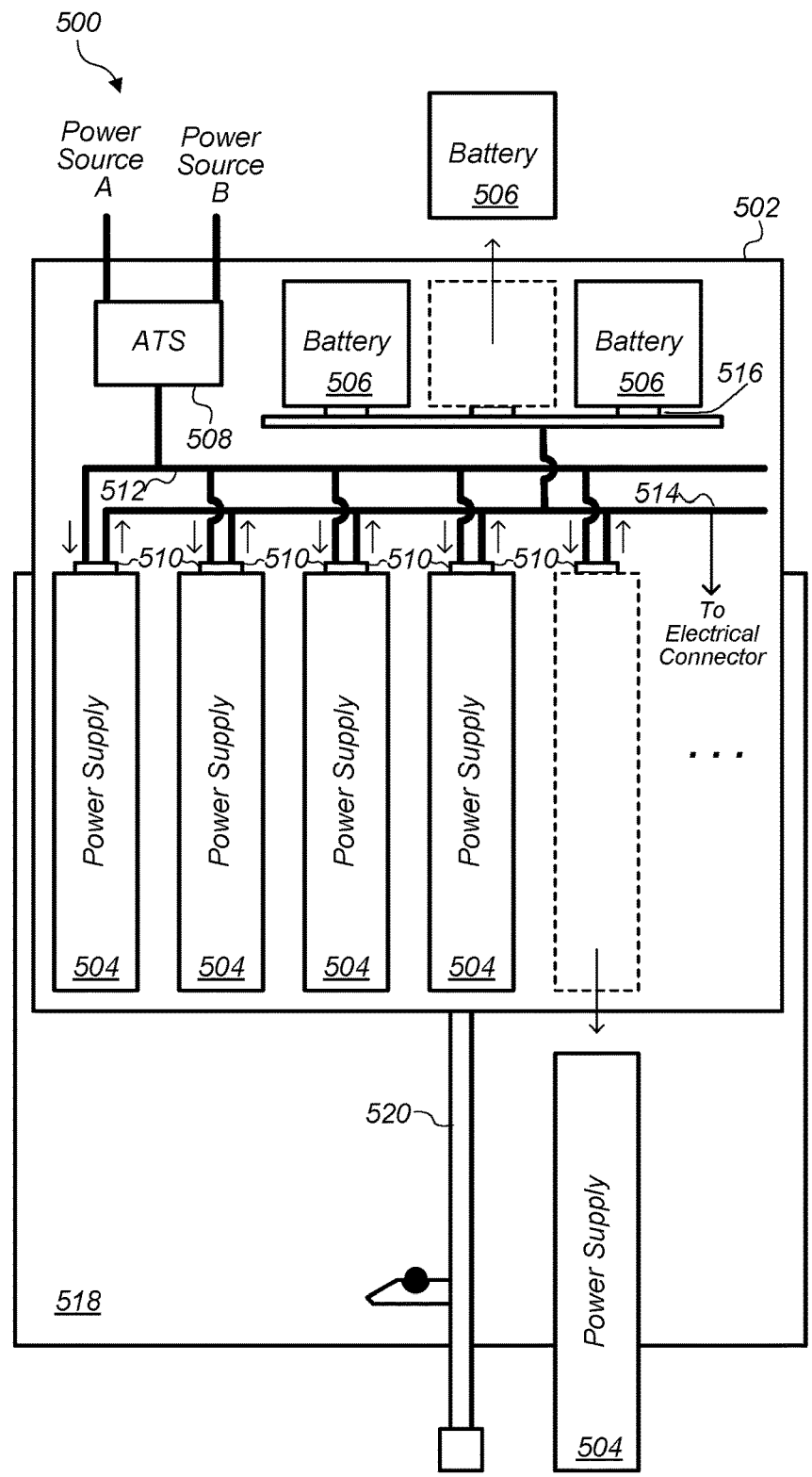
FIG. 5 is a schematic diagram illustrating internal components of an external power supply containment unit, according to some embodiments.

FIG. 5 is a schematic diagram illustrating internal components of an external power supply containment unit, according to some embodiments. Power supply containment unit 500 includes chassis 502 and power supplies 504 mounted in chassis 502. In some embodiments, an external power supply containment unit may further include batteries. For example, power supply containment unit 500 also includes batteries 506 mounted in chassis 502. In some embodiments, an external power supply containment unit may include other types of reserve power sources in addition to or in place of batteries, such as super capacitors, a flywheel, a fuel cell, etc. Also, in some embodiments, an external power supply containment unit, such as power supply containment unit 500, may include a single power inlet (not shown) or dual power inlets (as shown in FIG. 5), such as power inlets connected to power sources A and B. In embodiments, with multiple power inlets, an external power supply containment unit may include an automatic transfer switch (ATS) configured to select one of the multiple power inlets to feed the discrete power supplies included in the external power supply containment unit. For example, power supply containment unit 500 includes ATS 508 that is configured to selectively feed electrical power from power source A or power source B to power supplies 504. In some embodiments, a power source such as power source A or power source B may feed alternating current (AC) electrical power at a higher voltage, for example a voltage greater than 100 volts.

In some embodiments, discrete power supplies included in an external power supply containment unit may convert AC electrical power into DC electrical power, may lower a voltage of rectified electrical power, or may further condition the rectified electrical power. In some embodiments, discrete power supplies of an external power supply containment unit, such as power supplies 504 of power supply containment unit 500, may include one or more components that condition electrical power received from a power source (for example AC electrical power) such that the power is suitable for consumption by downstream electrical devices. For example, discrete power supplies, such as discrete power supplies 504, may include one or more rectifiers, transformers, filters, or other types of electrical devices configured to condition AC electrical power at a higher voltage received from power sources, such as power source A or power source B, into lower voltage DC power suitable for consumption by computing devices or other types of electrical devices. In some embodiments, discrete power supplies, such as power supplies 504, may provide DC electrical power at or about a voltage of 12-48 volts DC to downstream components that consume power provided by an external power supply containment unit, such as computing devices or other types of electrical devices that receive electrical power from power supply containment unit 500.

In some embodiments, an external power supply containment unit, such as power supply containment unit 500, may include blind-mate connectors that connect discrete power supplies and batteries to one or more power circuits within the external power supply containment unit. For example, in power supply containment unit 500 power supplies 504 are connected to AC power circuit 512 and DC power circuit 514 via blind-mate connectors 510. Also batteries 506 are connected to DC power circuit 514 via blind-mate connectors 516. In some embodiments, a DC power circuit of an external power supply containment unit, such as DC power circuit 514, may be connected to electrical connectors of the external power supply containment unit, such as connection sockets as described in FIGS. 1-3, electrical plugs or sockets as described in FIG. 4, or other types of electrical connectors. Conditioned DC electrical power may be fed to downstream loads from discrete power supplies included in an external power supply containment unit via a DC power circuit, such as DC power circuit 514, and electrical connectors, such as connection sockets coupled to a power distribution system of a rack or sockets and plugs.

In some embodiments, discrete power supplies and/or batteries of an external power supply containment unit may be hot-swappable. For example, one of power supplies 504 may be removed from chassis 502 of power supply containment unit 500 while others ones of power supplies 504 remain in chassis 502 and while power supply containment unit 500 is coupled with a rack, such as rack 518, via a locking mechanism, such as locking mechanism 520. In some embodiments, a locking mechanism of an external power supply containment unit may be positioned such that discrete power supplies can be removed by sliding individual ones of the discrete power supplies out of a portion of a chassis of a power supply containment unit above the locking mechanism. For example, one of discrete power supplies 504 may slide out over locking mechanism 520. In a similar manner, batteries, such as one of batteries 506, may slide out of a chassis of an external power supply containment unit while the external power supply containment unit is coupled with a rack.

In some embodiments, an external power supply containment unit may include N+1 discrete power supply units, where "N" is a minimum number of discrete power supply units needed to support a load connected to the external power supply containment unit. Thus, one of the discrete power supply containment units may fail or be removed from the external power supply containment unit while other ones of the discrete power supply units provide electrical power to a load connected to the external power supply containment unit without losing the ability to support the load connected to the external power supply containment unit. In a similar manner, in some embodiments, an external power supply containment unit may include N+1 batteries.

Any of the external power supply containment units described herein may include components such as the components described above that are included in power supply containment unit 500 illustrated in FIG. 5.

Figure 6:
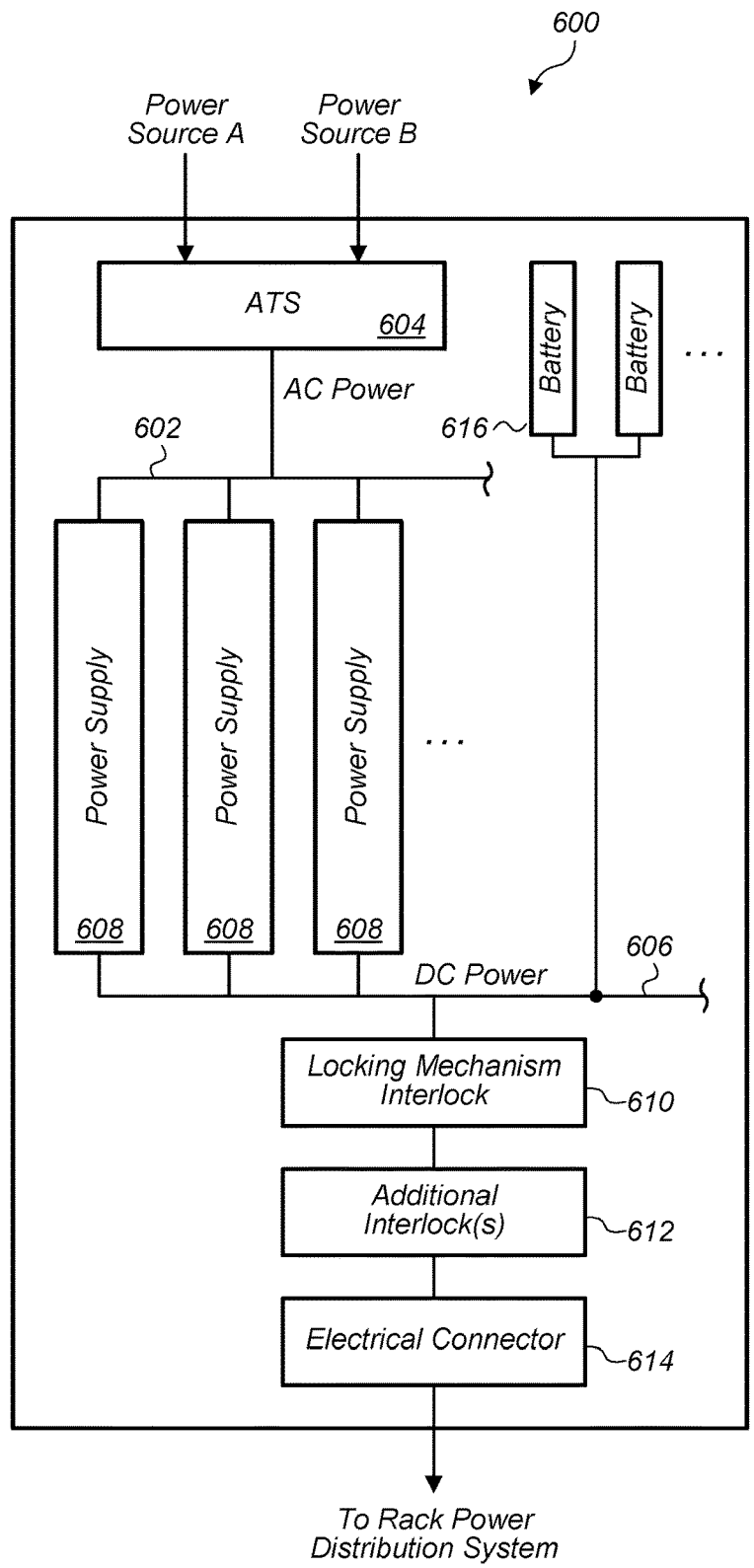
FIG. 6 is a schematic diagram illustrating an example power flow through components of an external power supply containment unit, according to some embodiments.

FIG. 6 is a schematic diagram illustrating an example power flow through components of an external power supply containment unit, according to some embodiments. In some embodiments, an external power supply containment unit, such as power supply containment unit 600, may include connections to more than one power source, for example connections to power source A and power source B. In some embodiments, an external power supply containment unit, such as power supply containment unit 600, may further include an automatic transfer switch (ATS), such as ATS 604, configured to selectively feed electrical power from one of the multiple power inputs and in case of failure of one of the multiple power inputs, automatically feed electrical power from another one of the multiple power inputs.

An output of the ATS, such as ATS 604, may be coupled to an AC bus, such as AC bus 602, that is connected to multiple discrete power supplies, such as power supplies 608. The power supplies, such as power supplies 608, may include a rectifier circuit, transformer, filter, or other type of electrical circuit configured to condition electrical power received from a power source, such as power sources A or B. An output of the discrete power supplies may feed a DC bus, such as DC bus 606. In some embodiments, an external power supply containment unit may further include one or more reserve power sources, such as batteries 616, coupled to a DC bus, such as DC bus 606.

In some embodiments, power from the DC bus may be stopped by one or more interlocks that prevent power from the DC bus from flowing to electrical connectors of an external power supply containment unit when one or more conditions are not met. For example, a locking mechanism interlock, such as locking mechanism interlock 610, may prevent DC power from energizing electrical connectors, such as electrical connectors 614, when one or more conditions are not met. In some embodiments, an external power supply containment unit may include one or more additional interlocks, such as additional interlock(s) 612. In some embodiments, a locking mechanism interlock may not allow electrical power to energize electrical connectors until a locking mechanism such as locking mechanism 124 or 140 illustrated in FIG. 1 or locking mechanism 224 illustrated in FIG. 2 are fully engaged. In some embodiments, a locking mechanism interlock may not allow electrical power to energize electrical connectors until a locking mechanism such as depressed floor tile 374 illustrated in FIG. 3C, indicates that a rack castor is positioned on top of a limit switch of the depressed floor tile. In some embodiments, a locking mechanism interlock may not allow electrical power to energize electrical connectors until other types of locking mechanisms are fully engaged and/or indicate that a rack is in a proper position adjacent to an external power supply containment unit.

In some embodiments, a locking mechanism interlock may include a mechanical interlock component such as a mechanical linkage and an electronic interlock component, such as an electrical isolation device. Furthermore, in some embodiments, a locking mechanism may include additional electronic interlocks components such as switches, proximity sensors, position sensors, etc. For example, a locking mechanism interlock may include one or more limit switches or position switches.

In some embodiments, an external power supply containment unit may include additional interlocks in addition to a locking mechanism interlock. For example, an external power supply containment unit, such as power supply containment unit 356 or any of the other external power supply containment units described herein, may additionally include a limit or position switch. For example, power supply containment unit 356 may include a limit switch adjacent to connection socket 362. A button of the limit switch may be depressed by a part of rack 352 when the rack 352 is in position under power supply containment unit 356. Additionally, an external power supply containment unit may include various other additional interlocks. For example, an external power supply containment unit may include sensors that determine that one or more loads are connected, via current sensing, resistance sensing, capacitance sensing, etc. The additional interlocks may not allow electrical connectors of the external power supply containment unit to be energized when it is determined that a load is not connected to electrical connectors of the external power supply containment unit. In some embodiments, various other types of sensors and/or switches may be used in a locking mechanism interlock or an additional interlock.

Figure 7A:
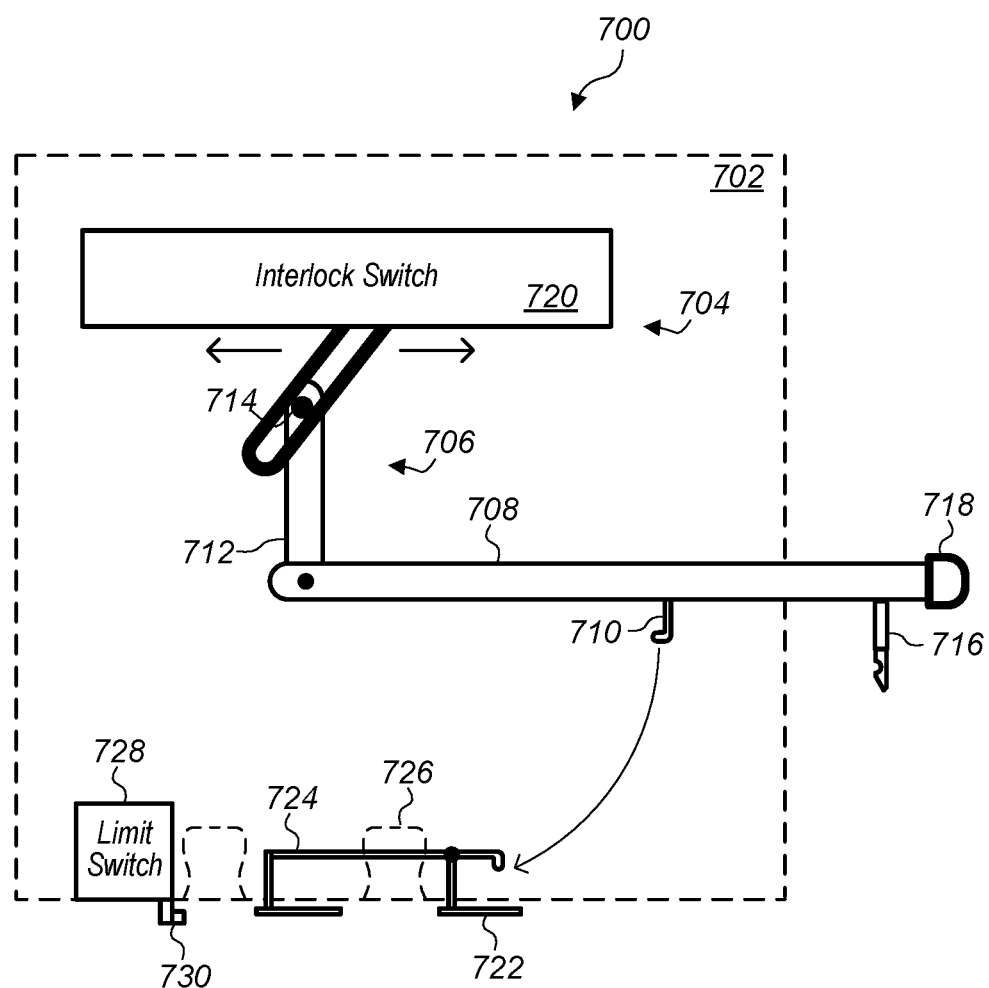
FIGS. 7A-7B are schematic diagrams illustrating components of an interlock mechanism and safety shutters of an external power supply containment unit, according to some embodiments.
Figure 7B:
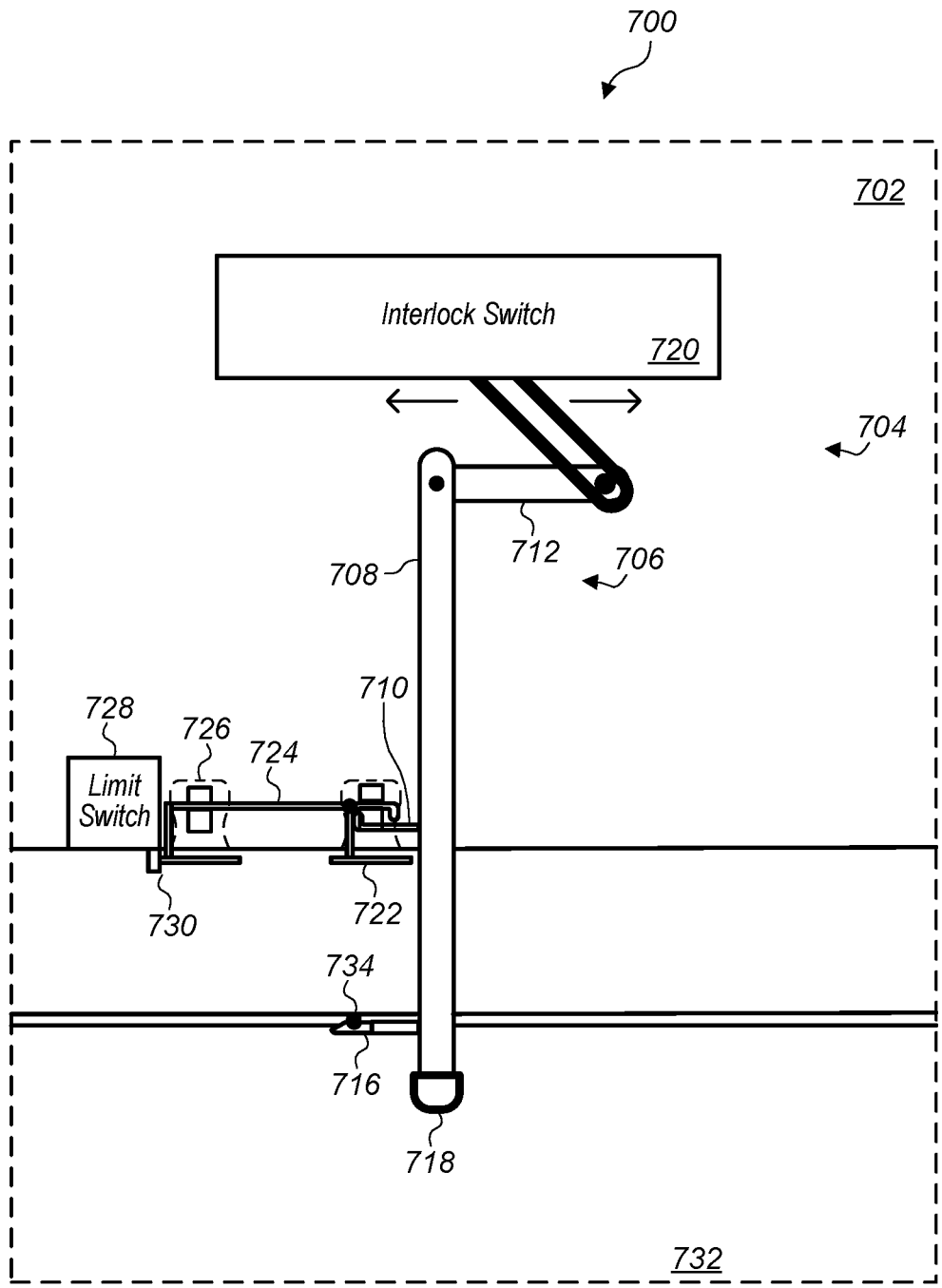

FIGS. 7A-7B are schematic diagrams illustrating components of an interlock mechanism and safety shutters of an external power supply containment unit, according to some embodiments. Note that FIGS. 7A-7E illustrate example mechanical interlocks that interact with safety shutters, though in some embodiments, various other types of mechanical interlocks may be used in an external power supply containment unit.

Power supply containment unit 700 includes chassis 702. Chassis 702 may include components such as discrete power supplies, batteries, an ATS, etc. as illustrated in FIG. 5. Additionally, chassis 702 of power supply containment unit 700 may include locking mechanism interlock 704, which may include mechanical linkage 706 and electrical interlock device 720. In some embodiments, electrical interlock device 720 may be a switch, shunt trip, or other type of electrical device that can isolate electrical connectors of an external power supply containment unit from a power source. In some embodiments, mechanical linkage 706 includes one or more linkage members, such as linkage members 708 and 712. In some embodiments, a linkage member, such as linkage member 712, may be coupled to an electrical interlock device, such as electrical interlock device 720, via a connection, such as pin connection 714 or other suitable type of connection. The connection may cause the electrical interlock device to change states, for example, to switch from an open state to a closed state, as the linkage member translates or rotates. In some embodiments, one of the linkage members of the mechanical linkage may be a part of a locking mechanism or may be attached to a locking mechanism. For example, linkage member 708 may be any of the locking mechanisms described herein. Linkage member 708 includes clasp 716 configured to engage with a pin mounted on a rack. Additionally, linkage member 708 includes handle 718. A handle, such as handle 718, may be used to move a linkage member that is also a locking mechanism. For example, handle 718 may be used to move linkage member 708 such that clasp 716 engages a pin mounted on a rack.

In some embodiments, a mechanical linkage of an external power supply containment unit, such as mechanical linkage 706, may be configured to cause one or more safety shutters to close before a locking mechanism is fully engaged and before electrical power is allowed to energize electrical connectors of the external power supply containment unit. For example, linkage member 708 includes clip 710 that extends out from linkage member 708 and engages a safety shutter, such as shutters 722, prior to a locking mechanism, such as linkage member 708, reaching a fully engaged position and prior to a linkage member, such as linkage member 712, causing an electrical interlock device, such as electrical interlock device 720, to energize electrical connectors of an external power supply containment unit, such as connection sockets 726 of power supply containment unit 700. For example, linkage member 708 and clip 710 contacting shuttle mechanism 724 connected to shutters 722 may cause shutters 722 to close and shield connection sockets 726, wherein connection sockets 726 are closed by shutters 722.

In some embodiments, an external power supply containment unit, such as power supply containment unit 700, may include an additional interlock, such as a limit switch to ensure that safety shutters are closed before energizing electrical connectors. For example, power supply containment unit 700 includes limit switch 728 that includes button 730 that is depressed by shutters 722 when shutters 722 are closed. The limit switch may be connected to an additional electrical interlock device downstream or upstream of a locking mechanism electrical interlock device, such as electrical interlock device 720. In some embodiments, a locking mechanism electrical interlock device, such as electrical interlock device 720, may not allow electrical connectors, such as connection sockets 726, to be energized until both a linkage member, such as linkage member 712, causes the switch of electrical interlock device to change positions and a limit switch, such as limit switch 728, indicates to the electrical interlock device that safety shutters, such as shutters 722, are closed.

For example, in FIG. 7B, linkage member 708 is in a fully engaged position and is engaged with pin 734 of rack 732 to secure rack 732 in place. Clip 710 has pushed against shuttle mechanism 724 to cause shutters 722 to close over openings of connection sockets 726. Furthermore, shutters 722 push against button 730 of limit switch 728 to indicate that shutters 722 are closed. Additionally, movement of linkage member 708 to the fully engaged position has caused linkage member 712 to rotate and cause a switch of interlock electronic device 720 to switch from an open state to a closed state. Thus, a condition that a rack be secured to an external power supply containment unit is satisfied by a locking mechanism being in a fully engaged position and an additional interlock condition is satisfied by safety shutters being in a closed position. In some embodiments, an external power supply containment unit may then energize electrical connectors of the external power supply containment unit, for example connection sockets 726, in response to the interlock condition(s) being met.

Figure 7C:
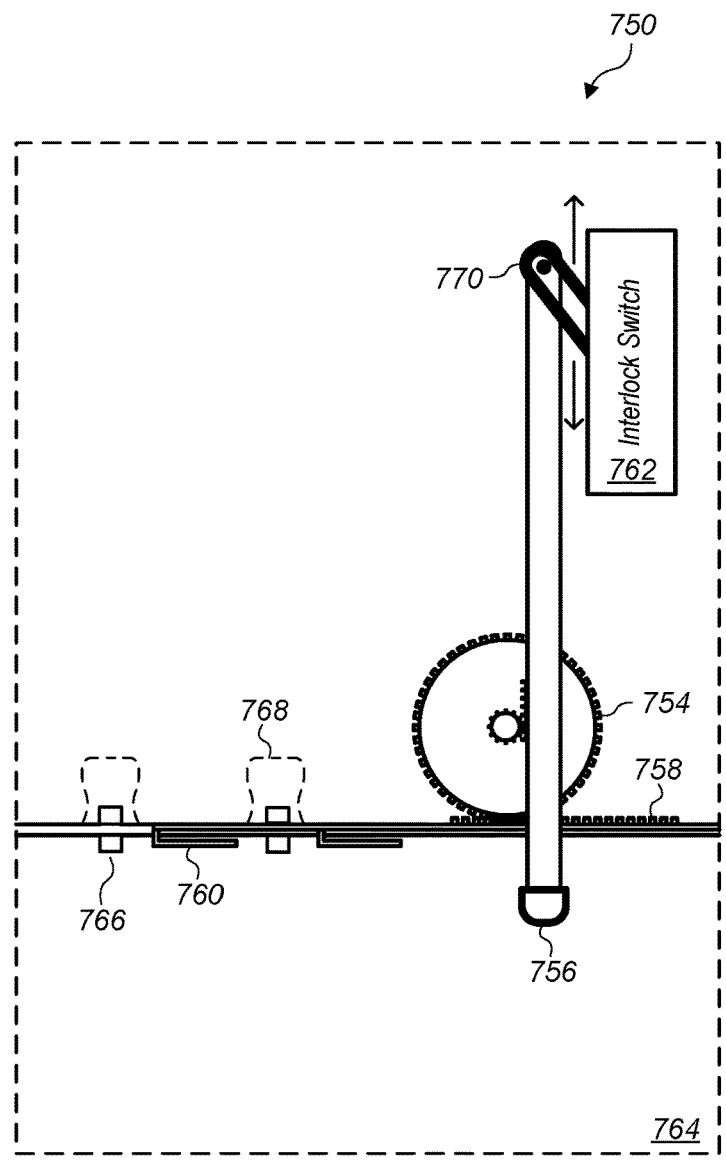
FIGS. 7C-7E are schematic diagrams illustrating components of an interlock mechanism and safety shutters of an external power supply containment unit, according to some embodiments.
Figure 7D:
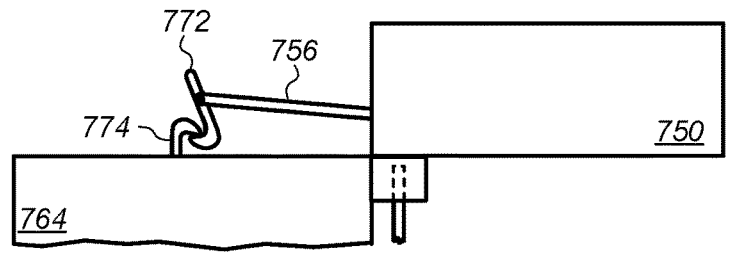
Figure 7E:
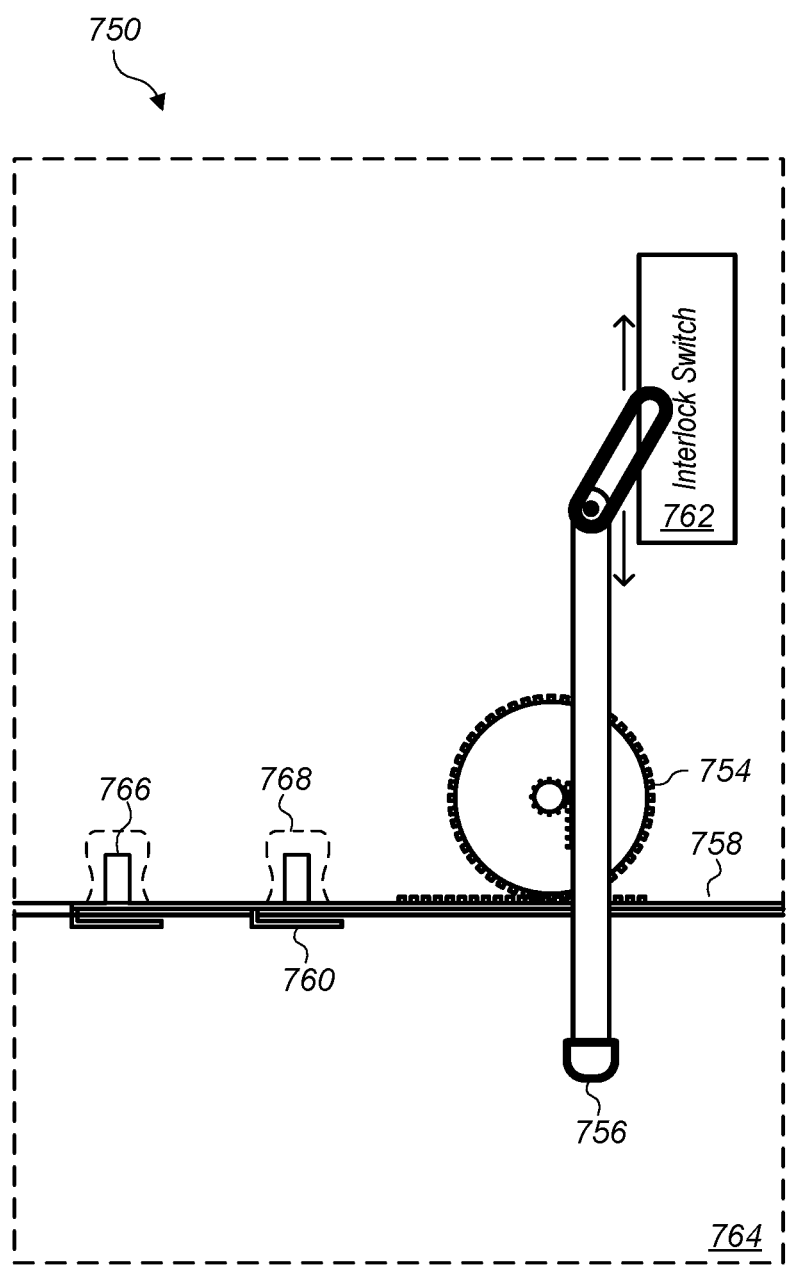

FIGS. 7C-7E are schematic diagrams illustrating components of an interlock mechanism and safety shutters of an external power supply containment unit, according to some embodiments. The mechanical interlock system shown in FIGS. 7C-7E is another example of one of many possible mechanical interlock systems that may be used in an external power supply containment unit. Whereas, the mechanical interlock system shown in FIGS. 7A-B included rotating and translating linkage members, an alternate mechanical interlock system, such as shown in FIGS. 7C-E may include gears in place of linkage members. For example, power supply containment unit 750 includes gears 754 coupled to locking mechanism 756 and shuttle mechanism 758. Shuttle mechanism 758 is coupled to shutters 760 and moves with shutters 760. Power supply containment unit 750 also includes electrical interlock device 762 coupled with locking mechanism 756 via connection 770.

Rack 764 is positioned adjacent to power supply containment unit 750 such that ends of bus bars 766 are partially inserted into connection sockets 768 of power supply containment unit 750. As shown in FIG. 7D, buckle 772 coupled to locking mechanism 756 engages with pin 774 of rack 764 to secure rack 764 in a position adjacent to power supply containment unit 750. As shown in FIG. 7E, as buckle 772 is fully engaged, locking mechanism 756 is pulled away from power supply containment unit 750. This causes gears 754 to rotate. The rotation of gears 754 engages with gear teeth of shuttle mechanism 758 and causes shuttle mechanism 758 to translate and move shutters 760 over openings of connection sockets 768 to close connection sockets 768. Also bus bars 766 are further drawn into connection sockets 768 by the closing of buckle 772. Additionally, locking mechanism 756 being pulled away from power supply containment unit 750 causes electrical interlock device 762 to change positions from an open position to a closed position.

Figure 8A:
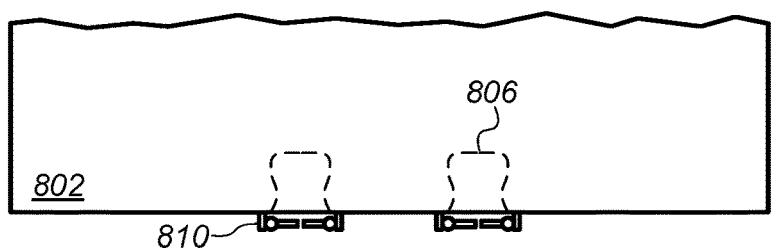
FIGS. 8A-8C are schematic diagrams illustrating operation of safety shutters of an external power supply containment unit, according to some embodiments.
Figure 8B:
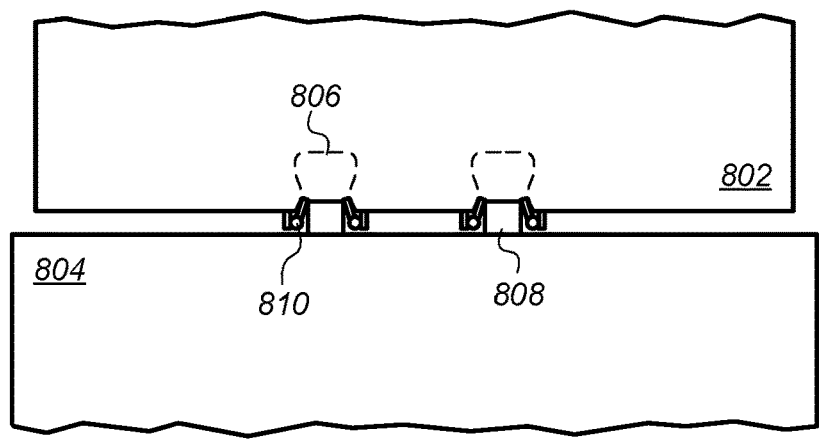
Figure 8C:
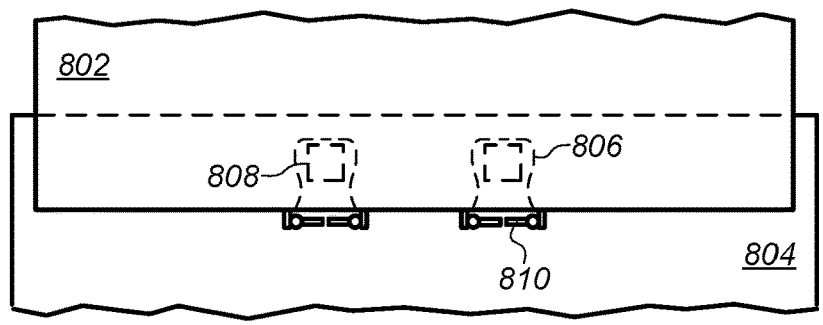

In some embodiments, safety shutters of an external power supply containment unit may close automatically without being operated by a mechanical linkage or mechanical gear apparatus. For example, FIGS. 8A-C are schematic diagrams illustrating operation of safety shutters of an external power supply containment unit, according to some embodiments. For example, power supply containment unit 802 includes pivotally mounted sets of shutters 810 located in front of connection sockets 806. As a portion of a power bus bar is inserted into a connection socket, a pivotally mounted set of safety shutters may rotate to allow the power bus bar to enter the connection socket. For example, in FIG. 8B pivotally mounted safety shutters 810 are rotated to allow power bus bar 808 of rack 804 to enter connection sockets 806 of power supply containment unit 802. Once power bus bars of a rack are fully inserted into a connection socket, pivotally mounted safety shutters may automatically close behind the power bus bar. For example, in FIG. 8C power bus bars 808 are fully inserted into connection sockets 806 and pivotally mounted safety shutters have rotated back to a closed position. Any of the external power supply containment units described in FIGS. 1-7 and 9-11 may include pivotally mounted safety shutters as described in regard to FIGS. 8A-8C. For example, in some embodiments, an external power supply containment unit may include safety shutters operated by a shuttle mechanism as described in FIGS. 7A-E and may additionally include pivotally mounted safety shutters. In some embodiments, a shuttle mechanism may lock pivotally mounted safety shutters in a locked position once a power bus bar is fully engaged in a connection socket. In some embodiments, an external power supply containment unit may include pivotally mounted safety shutters without including additional safety shutters or a shuttle mechanism.

Figure 9:
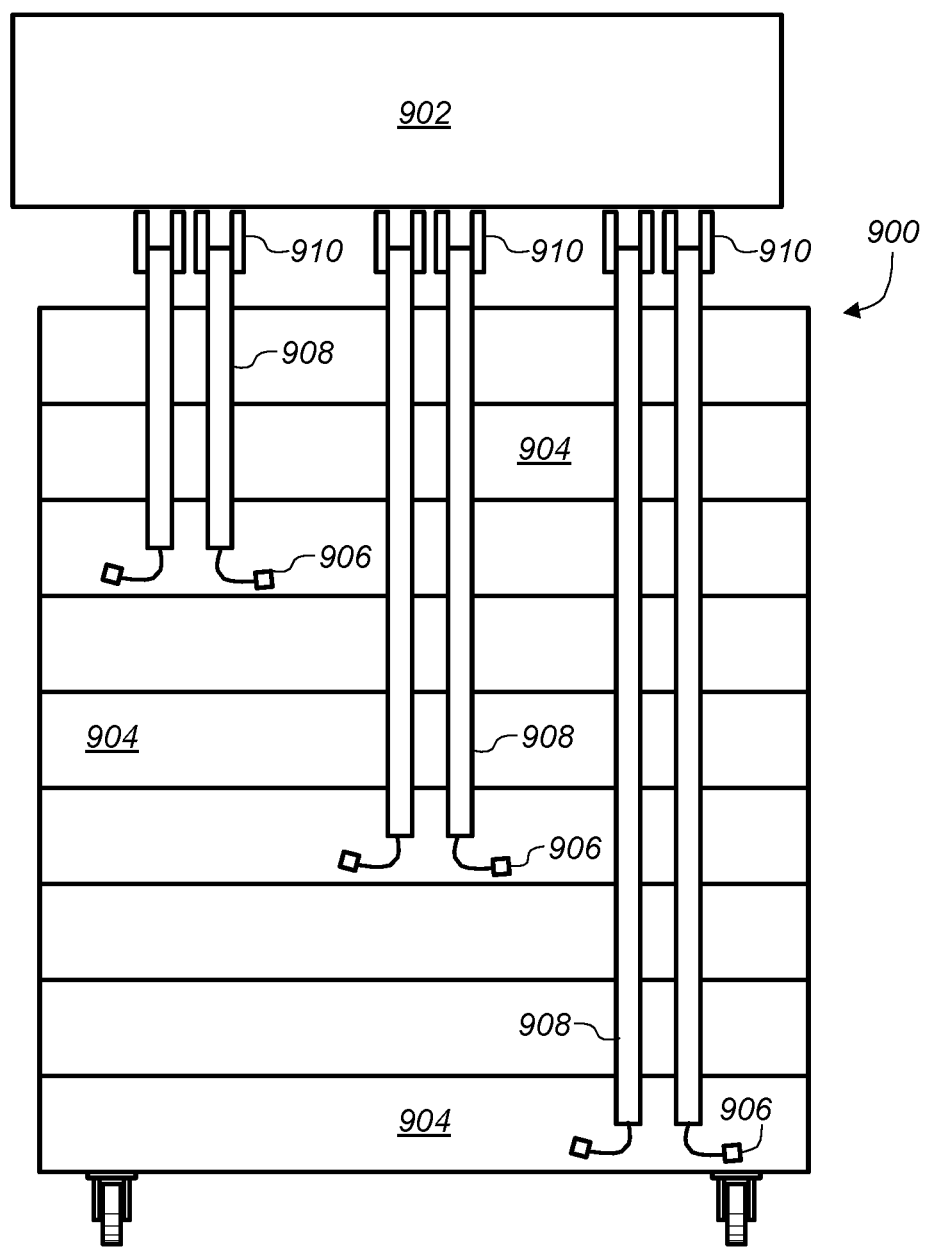
FIG. 9 is a schematic diagram illustrating a back view of a power supply containment unit electrically coupled to multiple power distribution systems of a rack of electrical devices, according to some embodiments.

In some embodiments, a power distribution system of a rack may include multiple sets of power bus bars, wherein different ones of the power bus bars distribute electrical power to different sets of electrical devices mounted in the rack. For example, FIG. 9 is a schematic diagram illustrating a back view of a power supply containment unit electrically coupled to multiple power distribution systems of a rack of electrical devices, according to some embodiments. For example, rack 900 includes electrical devices 904 that receive electrical power from different ones of power bus bars 908. In some embodiments, an external power supply containment unit, such as power supply containment unit 902 may include multiple sets of electrical connectors configured to provide power to multiple parts of a power distribution system of a rack. For example, power supply containment unit 902 includes three sets of connection sockets 910 configured to couple with ends of power bus bars 908 of rack 900. In some embodiments, a power supply containment unit, such as any of the external power supply containment units described herein, may include any number of electrical connectors configured to couple with one or more rack power distribution systems.

In some embodiments, a power distribution system of a rack, such as any or all of power bus bars 908 of rack 900, may include an additional back-feed electrical connector, such as one of plugs 906. In some situations an additional back-feed electrical connector of a rack power distribution system, such as one of plugs 906, may be used to back feed electrical power to electrical devices mounted in a rack while power is unavailable from an external power supply containment unit. For example, while electrical power is unavailable from power supply containment unit 902, electrical power may be back fed to electrical devices 904 by connecting one or more of plugs 906 to a separate electrical power source. In some embodiments, electrical power may be unavailable from an external power supply containment unit for various reasons. For example maintenance may be being performed on the external power supply containment unit or a power source that supplies the external power supply containment unit with electrical power may be disrupted. Also, electrical power may be unavailable because an external power supply containment unit is being replaced. In some embodiments, an additional back-feed electrical connector of a power distribution system, such as one of plugs 906, may be normally disconnected from a back feed power source and may be connected to a back feed power source for particular time periods during which electrical power is not available from an external power supply containment unit, such as power supply containment unit 902. In some embodiments, a back feed power source may supply direct current power conditioned for consumption by electrical devices mounted in a rack. In some embodiments, any of the rack power distribution systems described herein may include additional back-feed electrical connectors, such as plugs 906. In some embodiments, plugs 906 may be omitted.

Figure 10:
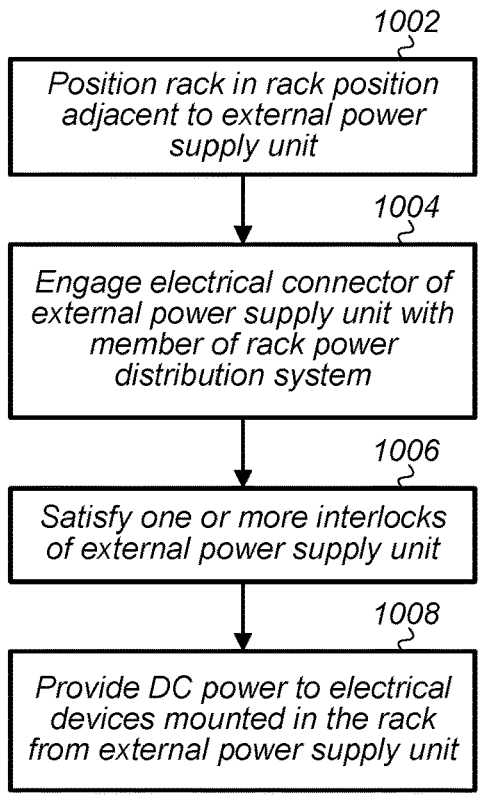
FIG. 10 illustrates a process of installing a rack of electrical devices using an external power supply containment unit, according to one embodiment.

FIG. 10 illustrates a process of installing a rack of electrical devices using an external power supply containment unit, according to one embodiment.

At 1002 a rack is positioned adjacent to an external power supply containment unit that is mounted in a structure external to the rack. For example the power supply containment unit may be mounted to an overhead structure, a sub-floor structure, or another structure external to the rack.

At 1004 an electrical connector of the external power supply containment unit is engaged with a member of a power distribution system of the rack. For example, the electrical connector may be a connection socket that engages with an end of a power bus bar of a power distribution system of the rack. In some embodiments, the electrical connector may be an electrical plug or socket that engages with an electrical plug or socket of a power distribution system of the rack. In some embodiments, other types of electrical connectors may be used.

At 1006, one or more interlock conditions are satisfied before an electrical connector of the external power supply containment unit is energized. For example, the interlock condition may be that a locking mechanism is fully engaged, one or more safety shutters are in a closed position, a position switch or limit switch indicates that a rack is in an appropriate position, or other types of conditions.

At 1008, once the one or more interlock conditions are satisfied, the electrical connectors of the power supply containment unit are energized and DC electrical power suitable for consumption by electrical devices, such as computer devices and computer device components, is provided to electrical devices mounted in the rack via the power distribution system of the rack engaged with the electrical connector of the external power supply containment unit.

Figure 11:
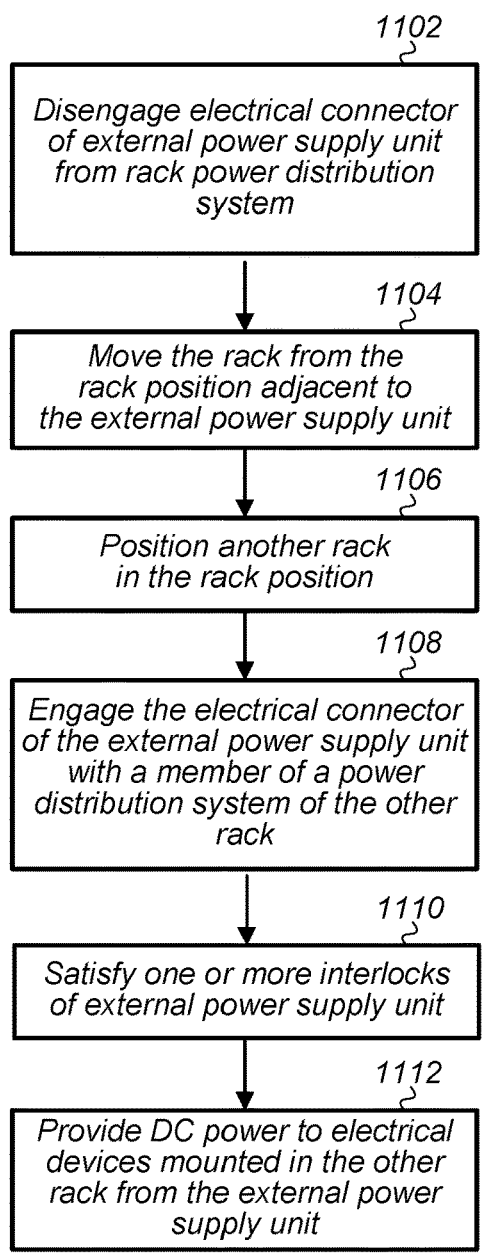
FIG. 11 illustrates a process of exchanging a rack of electrical devices using an external power supply containment unit, according to some embodiments.

FIG. 11 illustrates a process of exchanging a rack of electrical devices using an external power supply containment unit, according to some embodiments.

After a rack has been installed and coupled with an external power supply containment unit as described in FIG. 10, the rack may be removed and replaced. At 1102, a rack that was previously coupled with an external power supply containment unit (for example as described in 1002-1008) is removed. The first part of removal may include disengaging an electrical connector of the rack from an electrical connector of the external power supply containment unit. For example, this may include opening a locking mechanism or disconnecting a plug and socket connection. In some embodiments, an external power supply containment unit may include one or more power switches and a power switch may be positioned in an "off" position prior to disengaging an electrical connector of an external power supply containment unit from a rack power distribution system. In some embodiments, releasing a locking mechanism may automatically turn off a power supply containment unit.

At 1104, the rack is moved from the position adjacent the external power supply containment unit and at 1106 another rack is positioned in the position adjacent to the external power supply containment unit.

At 1108 an electrical connector of the external power supply containment unit is engaged with a member of a power distribution system of the replacement rack in a similar manner as described at 1004. At 1110 one or more interlock conditions is satisfied in a similar manner as described in 1006 and at 1112 DC electrical power suitable for consumption by electrical devices, such as computer devices and computer device components, is provided to electrical devices mounted in the replacement rack via the power distribution system of the replacement rack engaged with the electrical connector of the external power supply containment unit.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system, comprising:
a rack comprising computing devices and a direct current (DC) power distribution bus bar configured to transmit DC electrical power to the computing devices of the rack; and
a mounting structure to mount a power supply containment unit external to the rack, wherein at least a portion of the mounting structure is external to the rack and at least a portion of the mounting structure is coupled to the rack;
a power supply containment unit mounted to the mounting structure that is at least partially external to the rack, wherein the power supply containment unit comprises:
a chassis;
a power inlet configured to receive electrical power from a power source;
power supplies mounted in the chassis and configured to convert the electrical power from the power source into DC electrical power for distribution to the computing devices of the rack; and
a connection socket configured to couple with the DC power distribution bus bar such that the DC electrical power from the power supplies external to the rack is distributed to the computing devices of the rack.

2. The system of claim 1, wherein:
the power supply containment unit is mounted to the structure above the rack;
the rack comprises a pin mounted on a surface of the rack; and
the power supply containment unit further comprises a locking mechanism configured to engage with the pin to secure the rack such that a portion of the DC power distribution bus bar is positioned in the connection socket of the power supply containment unit.

3. The system of claim 2, wherein the power supply containment unit further comprises an interlock configured to prevent electrical power from being fed to the connection socket when the locking mechanism is not in an engaged position.

4. The system of claim 1, wherein the rack further comprises a back-feed electrical connector coupled to the DC power distribution bus bar of the rack, wherein the back-feed electrical connector is configured to couple to a back-feed power source to supply electrical power to the computing devices mounted in the rack.

5. A system, comprising:
a power supply containment unit comprising:
an external chassis configured to be mounted to a structure external to a rack, at least a portion of the external structure coupled to the rack;
a power inlet configured to receive electrical power from a power source;
a power supply mounted in the external chassis and configured to convert the electrical power from the power source into direct current (DC) electrical power for distribution to electrical devices mounted in the rack; and
an electrical connector configured to couple with a DC power distribution system of the rack such that the DC electrical power from the power supply external to the rack is distributed to the electrical devices mounted in the rack.

6. The system of claim 5, wherein the power supply is configured to convert the direct current electrical power for distribution to the electrical devices mounted in the rack to a voltage that is less than 50 volts.

7. The system of claim 5, wherein:
the chassis is configured to be mounted above a rack position; or
the chassis is configured to be mounted in a sub-floor structure below a rack position.

8. The system of claim 5, wherein the electrical connector comprises an electrical socket configured to couple with an electrical plug coupled to the DC power distribution system of the rack.

9. The system of claim 5, wherein the electrical connector comprises a connection socket configured to couple with a portion of a bus bar of the DC power distribution system of the rack.

10. The system of claim 9, wherein the power supply containment unit further comprises shutters positioned at an opening of the connection socket, wherein the shutters are configured to shield the portion of the bus bar when the portion of the bus bar is positioned in the connection socket.

11. The system of claim 9, wherein the power supply containment unit further comprises a locking mechanism configured to engage with a pin of the rack to secure the rack such that the portion of the DC power distribution bus bar of the rack is positioned in the connection socket.

12. The system of claim 11, wherein the power supply containment unit further comprises an interlock configured to prevent electrical power from being supplied to the connection socket when the locking mechanism is not in an engaged position.

13. The system of claim 12, wherein the power supply containment unit further comprises an additional interlock configured to prevent electrical power from being supplied to the connection socket when shutters positioned at an opening of the connection socket are not in a closed position.

14. The system of claim 9, wherein the power supply containment unit further comprises:
a limit switch; and
an interlock mechanism configured to allow electrical power to be supplied to the connection socket only when the limit switch indicates that a rack is in position to receive electrical power from the power supply containment unit.

15. The system of claim 5, further comprising additional power supplies mounted in the power supply containment unit, wherein respective ones of the power supplies are configured to be removed from the power supply containment unit while the DC power distribution system of the rack is coupled with the electrical connector of the power supply containment unit and while other ones of the power supplies in the power supply containment unit are feeding electrical power to the electrical devices mounted in the rack.

16. The system of claim 5, wherein the power supply containment unit further comprises:
an additional electrical connector,
wherein the electrical connector is configured to supply power for distribution to a first portion of the electrical devices mounted in the rack and the additional electrical connector is configured to supply electrical power for distribution to another portion of the electrical devices mounted in the rack.

17. A method, comprising:
positioning a rack comprising electrical devices in a position adjacent to a power supply containment unit mounted to an external mounting structure that is at least partially external to the rack, at least a portion of the external mounting structure coupled to the rack;
engaging an electrical connector of the power supply containment unit with a member of a direct current (DC) power distribution system of the rack; and
distributing DC electrical power to the electrical devices mounted in the rack from a power supply of the power supply containment unit that is mounted, via the external mounting structure, external to the rack via the electrical connector engaged with the member of the DC power distribution system of the rack.

18. The method of claim 17, further comprising:
disengaging the electrical connector from the member of the DC power distribution system of the rack;
moving the rack from the position adjacent to the power supply containment unit;
positioning another rack comprising electrical devices in the position adjacent to the power supply containment unit;
engaging the electrical connector of the power supply containment unit with a member of a DC power distribution system of the other rack; and
providing direct current electrical power to the electrical devices mounted in the other rack from the power supply of the power supply containment unit via the electrical connector engaged with the member of the DC power distribution system of the other rack.

19. The method of claim 17, further comprising:
removing the power supply from the power supply containment unit while other power supplies of the power supply containment unit provide direct current electrical power to the electrical devices mounted in the rack.

20. The method of claim 18 further comprising:
satisfying an interlock condition prior to said providing direct current electrical power, wherein the power supply containment unit is configured to only provide direct current electrical power to the electrical connector of the power supply containment unit when the interlock condition is satisfied.

* * * * *